United States Patent [19]

Tchon

[11] 4,041,520
[45] Aug. 9, 1977

[54] UNIPHASE CHARGE TRANSFER DEVICE

[75] Inventor: Wallace Edward Tchon, Phoenix, Ariz.

[73] Assignee: Honeywell Information Systems Inc., Phoenix, Ariz.

[21] Appl. No.: 712,302

[22] Filed: Aug. 6, 1976

[51] Int. Cl.² .................... H01L 29/78; H01L 29/04; G11C 19/28
[52] U.S. Cl. .............................. 357/24; 307/221 D; 357/59
[58] Field of Search ......... 357/24; 307/221 C, 221 D, 307/304

[56] References Cited

U.S. PATENT DOCUMENTS

| 3,796,932 | 3/1974 | Amelio et al. | 357/24 |
| 3,906,542 | 9/1975 | Krambeck et al. | 357/24 |
| 3,918,997 | 11/1975 | Mohsen et al. | 357/24 |
| 3,930,893 | 1/1976 | Tchon | 357/24 |
| 3,980,902 | 9/1976 | Tchon | 357/24 |
| 4,007,446 | 2/1977 | Elmer et al. | 357/24 |

OTHER PUBLICATIONS

Melen et al. "One-Phase CCD: A New Approach to Charge-Coupled Device Clocking" IEEE J. Solid-State Circuits (2/72) pp. 92-93.

Gelberger et al. "A Uniphase Charge-Coupled Device" Proc. IEEE vol. 60 (6/72) pp. 721-722.

Primary Examiner—William D. Larkins
Assistant Examiner—Gene M. Munson
Attorney, Agent, or Firm—Walter W. Nielsen; William W. Holloway, Jr.

[57] ABSTRACT

A uniphase charge transfer device comprises a plurality of electrode pairs disposed over a layer of gate oxide which overlies a semiconductor substrate. Within the substrate are a plurality of first conduction regions which are doped to a conductivity type opposite to that of the substrate. The first conduction regions underlie the separations between electrode pairs, and each one is electrically connected to one member of each electrode pair. A plurality of second conduction regions in the substrate are of the same conductivity type as the substrate but are of a substantially greater density of impurity atoms, and each of the second conduction regions underlies a portion of the other member of each electrode pair. A single clock line is connected to that member of each electrode pair which overlies the second conduction region. By alternatingly applying a predetermined voltage to the single clock line, charge packets representing information are moved unidirectionally through the device.

10 Claims, 4 Drawing Figures

UNIPHASE CHARGE TRANSFER DEVICE

BACKGROUND OF THE INVENTION

This invention relates generally to charge-coupled semiconductor devices and, more particularly, to a charge transfer device (CTD) operated by a single clock line. In the ensuing description the uniphase charge transfer device of the present invention is referred to as a charge-coupled device (CCD), although CCD's are generally defined as charge transfer devices in which virtually all of the charge is transferred forward from one charge storage region to the next (complete charge transfer mode).

A known type of single-phase CCD is described in "Two-Phase Charge-Coupled Devices with Overlapping Polysilicon and Aluminum Gates," RCA Review, Vol. 34, March, 1973. In this article it is stated that a two-phase charge-coupled device can be operated with one of the phases biased to a DC voltage which is halfway between the minimum and the maximum voltage applied to the other phase. A similar single-phase CCD is described in "A CCD Line Adjustable Random-Access Memory (LARAM)", IEEE Journal of Solid State Circuits, Vol. SC-10, No. 5, October, 1975, wherein is disclosed a buried channel CCD in which the buried channel contains a series of barrier implants. As with the CCD described in the first publication, alternate electrodes are held at a fixed DC potential approximately halfway between the potential extremes of the clocked electrodes. The aforementioned types of single-phase CCD's do not in actuality dispense with the necessity for two separate clock lines, and thus such devices are subject to attendant problems of phase synchronization and limitations on device layout and density.

The RCA Review article also states that a uniphase CCD which requires only a single set of clocked gates can be constructed by using a fixed charge in the channel oxide as a built-in bias to achieve the required potential profile. U.S. Pat. No. 3,796,933 describes a variation of this type of single-phase CCD, wherein the semiconductor substrate contains an impurity gradient from one end of the device to the other. The impurity gradient, together with the single-phase clocking, creates the unidirectionality of charge movement through the device. The CCD disclosed in U.S. Pat. No. 3,796,933 necessarily has a limitation on the number of consecutive storage regions, due to the requirement for a graduated impurity region in the substrate. Furthermore, the construction of CCD's having graduated impurity regions is rather complicated. In addition such devices contain unsealed channels which cause well known deleterious effects and instabilities.

SUMMARY OF THE INVENTION

According to a preferred embodiment of the present invention, a uniphase CCD is disclosed in which certain disadvantages of the known prior art uniphase CCDs are overcome.

The present invention comprises a plurality of electrode pairs disposed over a gate oxide layer overlying a semiconductor substrate. Within the substrate are a plurality of first conduction regions of a conductivity type opposite to that of the substrate. The first conduction regions underlie the separations between electrode pairs, and each one is electrically connected to one member of each electrode pair. A plurality of second conduction regions in the substrate are of the same conductivity type as the substrate but are of a substantially higher density of impurity atoms. Each of the second conduction regions underlies a portion of the other member of each electrode pair. A single clock line is connected to that member of the electrode pair which overlies the second conduction region. By alternatingly applying a predetermined voltage to the single clock line, charge packets representing information are compelled to move in a predetermined direction through the device.

OBJECTS OF THE INVENTION

Accordingly, it is a principle object of the present invention to provide an improved charge-coupled semiconductor device.

It is another object of the invention to provide an improved uniphase charge-coupled device.

It is also an object of the invention to provide an improved uniphase charge-coupled device which utilizes a single clock line.

BRIEF DESCRIPTION OF THE DRAWINGS

The invention will be described with reference to the accompanying drawings, wherein.

DETAILED DESCRIPTION OF THE PREFERRED EMBODIMENT

Figure 1:
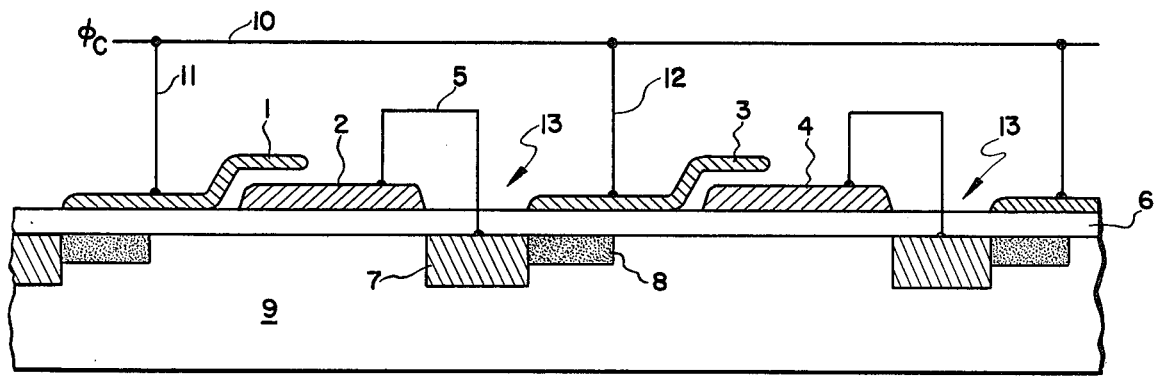
FIG. 1 is a schematic showing a cross-section of a portion of a charge-coupled device illustrating a preferred embodiment of the invention.

Referring now to the drawing, and in particular to FIG. 1, there is shown a cross-sectional schematic diagram of a portion of a charge-coupled device, comprising a substrate 9 of N-type semiconductor material, a gate oxide layer 6 of uniform thickness overlying the substrate 9, and two electrode pairs 1-2 and 3-4. The two members of each electrode pair are electrically isolated from one another by an insulative layer of silicon dioxide (not shown), which layer is grown either coincidentally with or in addition to the second oxide layer as a normal part of the known silicon gate process. The electrode pairs 1-2 and 3-4 comprise polysilicon (polycrystalline silicon which has been diffused with impurity atoms) in the preferred embodiment shown in FIG. 1. The composition of the electrodes could alternatively be metal, such as aluminum or gold.

In the substrate and underlying the gaps 13 between adjoining electrode pairs are heavily doped P++ diffusion regions 7. These regions may be formed by diffusing boron atoms, for example, into the N-type silicon substrate in standard doping densities (e.g., $10^{18}$ to $10^{21}$ atoms/cm$^3$). In the preferred embodiment, the diffusion regions 7 are doped to approximately $10^{20}$ atoms/cm$^3$.

As seen in FIG. 1, the diffusion region associated with each electrode pair (e.g., diffusion region 7 associated with electrode pair 1-2) is electrically connected by appropriate means to the second member of each electrode pair (i.e., electrode 2 of electrode pair 1-2). This connection causes a potential step in the surface potential. The surface potential beneath electrode 2 is necessarily higher than beneath diffusion region 7, since the potential on electrode 2 is provided by diffusion region 7. This barrier-store pair can be enhanced by varying the oxide thickness, by ion implantation, or by a combination thereof.

Also located in the substrate immediately adjacent to each diffusion region 7 are a plurality of second conduction regions 8 of N-type conductivity material having a doping density substantially more than that of the N-type substrate. The doping density of the second conduction region 8 of the preferred embodiment is approximately $10^{17}$ atoms/cm$^3$. From FIG. 1, it will be seen that the second conduction regions 8 underlie a portion of the first electrode member of each electrode pair (e.g. electrode 3 of electrode pair 3-4).

The single clock $\phi_C$ comprises a distribution line 10 having individual connections 11 and 12 to the first electrode member of electrode pairs 1-2, 3-4, etc.

The N+ barrier implant regions 8 may be formed by a phosphorous dose of approximately $2 \times 10^{12}$ atoms/cm$^2$ to the substrate. The specific process steps required to produce the P++ and N+ conduction regions will be apparent to one skilled in the art. Likewise, the optimum manner for connecting the single clock to the first member of each electrode pair and for connecting the second member of each electrode pair to the P++ conduction region 7 will be apparent to the practitioner of ordinary skill.

Figure 2:
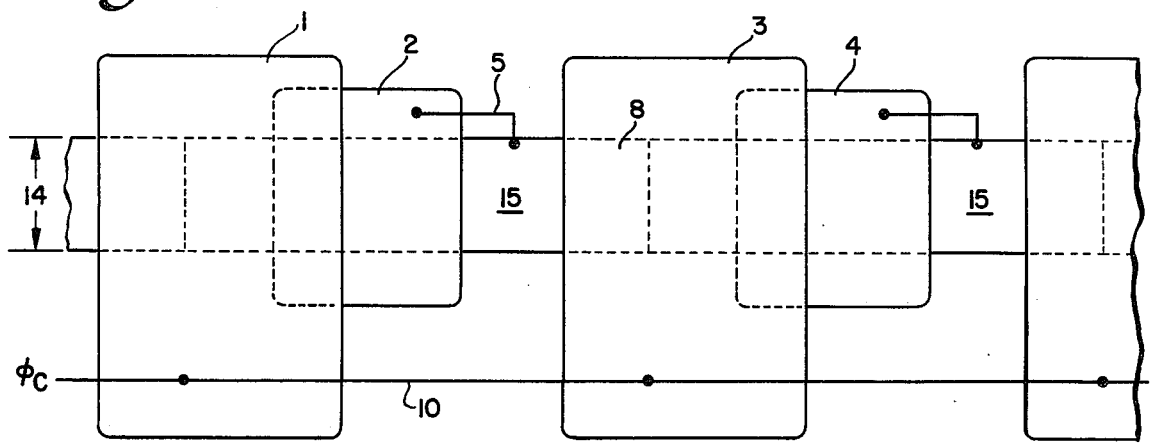
FIG. 2 is a schematic showing a top view of the portion of the charge-coupled device illustrated in FIG. 1.

With reference now to FIG. 2, a cross-sectional schematic diagram of the top portion of the charge-coupled device shown in FIG. 1 is illustrated. The active channel of the device, along which packets of charge move from left to right, is indicated by reference numeral 14. The first member of each electrode pair 1-2, 3-4, etc. is illustrated as being generally rectangular and somewhat larger in shape than the second member of each electrode pair; however, the actual relative sizes and shapes of the constituent members of the electrode pairs will be determined by the particular device fabrication process. The P++ regions 7 (FIG. 1) underlie that portion of the active channel 14 indicated by reference numeral 15 in FIG. 2, and the N+ conduction regions 8 are also shown in FIG. 2. The single clock line 10 is shown contacting each of the first members of the electrode pairs in the lower portion of FIG. 2. In the upper portion of FIG. 2 are shown the connection lines 5 between the second member of each electrode pair and each P++ region.

Figure 3:
FIG. 3 illustrates the clock pulse train applied to the electrodes of the charge-coupled device illustrated in FIGS. 1 and 2.
Figure 4:
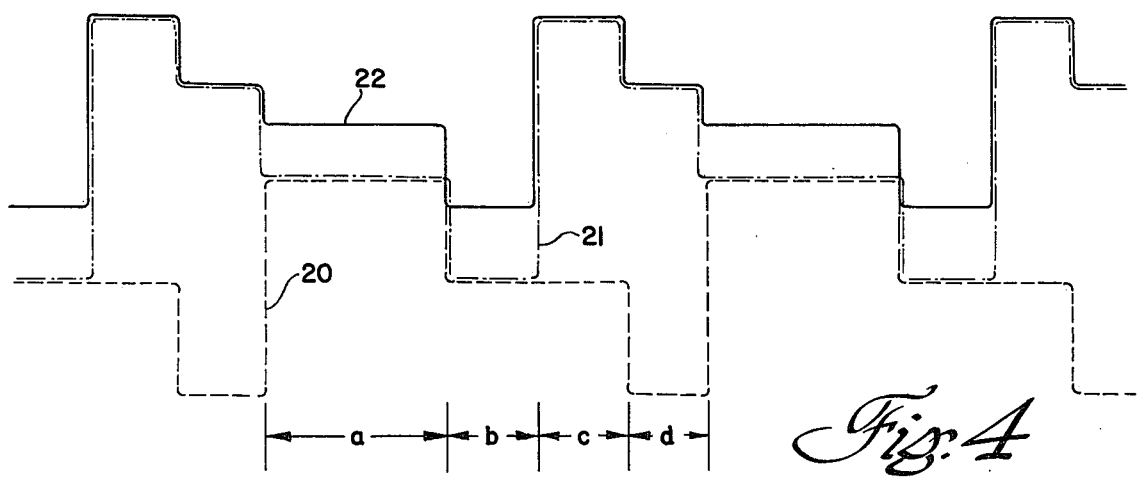
FIG. 4 illustrates the potential profiles for the charge-coupled device illustrated in FIGS. 1 and 2 under three different conditions of applied clock voltage and charge content.

The operation of a preferred embodiment of the uniphase charge-coupled device will now be explained with reference to FIGS. 1, 3, and 4. FIG. 3 illustrates the voltage clock pattern applied to the first member of each electrode pair of the CCD shown in FIG. 1. FIG. 4 illustrates the potential profiles during the operation of the uniphase CCD under three different conditions. The potential profiles 20-22 represent the surface potential along the interface between the substrate 9 and thin oxide layer 6. Potential profiles 20-22 outline the depths of the potential wells which are formed as a result of the particular given configuration of electrode members, N+ and P++ conduction regions, and the applied voltage.

For example, at time $t_1$ of the clock train shown in FIG. 3, $-12V$ is applied to the first member of each electrode pair. The applied negative voltage serves to repel majority carriers (electrons in the case of N-type substrate) from that portion of the active channel directly below the first electrode members 1, 3, etc. The depth of the potential wells formed at the surface of the substrate depends upon the magnitude of the voltage applied to the first electrode member. The greater the voltage applied to the electrode member, the deeper is the potential well beneath such member. The depth of the potential wells also depends upon the distance between the first electrode member and the substrate, the doping density of the substrate and N+ conduction region, the work functions of the substrate and electrode member, and the surface states $Q_{SS}$. The effect of the N+ barrier region 8 upon the surface potential profile is to produce a rise in the surface potential due to the presence of a relatively greater number of dopant atoms as compared to the surrounding N-type substrate material. That is, the N+ region 8 has a higher threshold voltage than the N-type substrate 9. The effect which the P++ conduction regions 7 have upon the potential profile is to form regions of high conductivity due to the presence of a high number of minority carriers in these regions.

Examining FIG. 4 now in greater detail, and potential profile 20 in particular, portion $a$ (the barrier region) of profile 20, representing the potential level beneath electrode member 2 of electrode pair 1-2, is the highest part of the profile at time $t_1$ of clock train $\phi_C$. At the opposite extreme, portion $d$ (the store region) of profile 20 is low due to the presence of a $-12V$ on electrode member 3 of electrode pair 3-4. Portion $d$ represents the potential beneath that part of electrode member 3 between the right-hand edge of the N+ conduction region 8 in FIG. 1 and the left-hand edge of electrode member 4. That portion of electrode member 3 which overlaps electrode member 4 has virtually no effect upon the potential profile, since it is separated from the substrate-oxide interface by the left-hand side of electrode member 4. The left-hand portion of electrode member 3 likewise has virtually no effect upon potential profile 20 due to the presence of the N+ conduction region 8 beneath it. Portion $c$ of profile 20 corresponds to the surface potential above the N+ conduction region 8. Portion $b$ corresponds to the surface potential above the P++ conduction region 7. At time $t_1$ the potential of portion $b$ is substantially identical to that of portion $c$.

Potential profile 21 represents the surface potential along the active channel 14 (FIG. 2) at time $t_2$ for the condition when the particular CCD cell under consideration is devoid of charge (i.e., contains a binary "0"). Under this condition portions $c$ and $d$ of profile 21 rise because of the relatively low voltage being applied to electrode member 3 of electrode pair 3-4. Portions $a$ and $b$ of profile 21 remain substantially as they were at time $t_1$, since their voltage parameters have not changed from the conditions in effect at time $t_1$.

Potential profile 22 of FIG. 4 represents the surface potential along the active channel 14 at time $t_2$ under the condition that the particular CCD cell under consideration contains a packet of minority charge carriers (i.e., contains a binary "1"). Portions $c$ and $d$ of profile 22 remain essentially as they were under the conditions prevailing with respect to potential profile 21. However, portions $a$ and $b$ of profile 22 are now relatively higher than they were for profile 21 due to the presence of the packet of minority charge carriers distributed throughout the P++ region 7 and the electrically connected electrode portion 2 of electrode pair 1-2. The presence of a large number of minority carriers (in this case, holes) in those regions of the CCD cell corresponding to portions a and b causes a raising of the potential profile 22 in portions a and b.

A charge packet of minority carriers is incrementally shifted from left to right through the uniphase CCD by applying the wave form shown in FIG. 3 to the first member of each electrode pair. For example, if a charge packet is initially present at time $t_2$ in portion b of profile 22, when the applied voltage changes to $-12V$ at time $t_1$ the charge packet will be dumped to the right into portion d of profile 20. After this transfer the surface potential of regions a and b return to their reference values as indicated by profile 21. Then at the next $t_2$ segment of the clock $\phi_C$ the charge packet will be shifted along to portion b of that part of profile 22 corresponding to the P++ region of the next CCD cell.

Regarding the condition when a potential well contains a packet of minority charge carriers representing a binary 1, at time $t_1$ such packet is located in portion d of potential profile 20. Under these conditions a certain amount of non-negligible capacitance exists between the charge storage region corresponding to portion d of profile 20 and the second electrode member of electrode pair 3-4. This capacitive coupling may have an undesirable effect on the operation of the CCD herein-disclosed. However, its effect can be minimized from a practical standpoint by the proper selection of the clock voltages on clock line 10, by the proper geometrical arrangement of the constituent members of the electrode pairs, and by limitations on the number of CCD stages if necessary.

Typical values for the dimensions of the various elements of the embodiment shown in FIG. 1 are 3000A for the polysilicon electrode members and 1000A for the channel oxide. It will be understood that these values are not necessarily optimized, and that one skilled in the art will be capable of making many modifications to the preferred embodiment according to the desired performance requirements. It should be understood that the relative dimensions of the various elements in the drawing are not to be considered accurate, as they have been distorted for ease in understanding the invention.

While the operation of the Uniphase Charge-Coupled Device has been given in terms of specific semiconductor material type, it will be understood that in general where N-type material is specified, P-type material may be substituted and vice versa.

It will be apparent to those skilled in the art that the disclosed Uniphase Charge-Coupled Device may be modified in numerous ways and may assume many embodiments other than the preferred form specifically set out and described above. For example, it may be advantageous to place the clock line 10 directly over the channel 14. Also, thin oxide layer 6 need not necessarily be of uniform thickness, but may be of a variable thickness depending on the device fabrication process, in order to optimize the barrier height. Further, the P++ conduction regions can be formed either through a diffusion or an ion implant process step. Regarding the electrical connection between the P++ conduction region and the second member of each electrode pair, such may comprise a metal link or, for example, a direct contact, depending upon the desired device geometries and operational characteristics.

In addition, a capacitive coupling may be substituted for the direct electrical connection 5 (FIGS. 1 and 2), such as by extending the P++ region 7 a certain distance beneath the second member of each electrode pair (e.g. electrodes 2, 4, etc.) or by other means well known to one of ordinary skill in the art.

The present invention has utility in both analog and digital circuits such as photosensor arrays, delay lines, shift registers, buffer memories, sequential-access memories, fast-access scratchpad memories, refresh memories, and other information storage and transfer mechanisms.

Accordingly, it is intended by the appended claims to cover all modifications of the invention which fall within the true spirit and scope of the invention.

What is claimed is:

1. A uniphase charge transfer device comprising
   a substrate of semiconductor material,
   an insulating layer of substantially uniform thickness on one surface of said substrate,
   a plurality of electrode pairs disposed on said insulating layer, a first electrode of each of said electrode pairs having a portion which overlaps the second electrode of each of said electrode pairs, the first and second electrodes of each electrode pair being in the same relative positions and of the same relative dimensions, and the first electrode of each electrode pair being laterally separated from the second electrode of an adjacent electrode pair by a separation of a predetermined length,
   a plurality of first conduction regions in said substrate and proximate to said surface of said substrate, said first conduction regions being heavily doped to a conductivity material type opposite to that of said substrate, said first conduction regions being located opposite to and substantially coextensive with said separations between adjacent electrode pairs,
   a plurality of second conduction regions in said substrate and proximate to said surface of said substrate, said second conduction regions being of the same conductivity material type as said substrate and having a substantially greater charge density than said substrate, said second conduction regions being located adjacent to said first conduction regions and underlying a portion of said first electrode of each of said electrode pairs,
   means for electrically connecting said second electrode of each of said electrode pairs with said first conduction region which is adjacent to it, and
   means for alternatingly applying a voltage of a given magnitude to said first electrode of each of said electrode pairs to cause minority charges to move in a predetermined direction along the surface of said substrate.

2. The uniphase change transfer device of claim 1 wherein said first conduction regions have a charge density of approximately $10^{20}$ atoms/cm$^3$, and said second conduction regions have a charge density of approximately $10^{17}$ atoms/cm$^3$.

3. The uniphase charge transfer device of claim 1 wherein said substrate comprises N type semiconductor material, said first conduction regions comprise P++ type semiconductor material, and said second regions comprise N+ type semiconductor material.

4. The uniphase charge transfer device of claim 1 wherein said substrate comprises P type semiconductor material, said first conduction regions comprise N++ type semiconductor material, and said second conduction regions comprise P+ type semiconductor material.

5. The uniphase charge transfer device of claim 1 wherein said means for electrically connecting said second electrode of each of said electrode pairs with said first conduction region which is adjacent to it comprises capacitive means.

6. A uniphase charge transfer semiconductor device for transmitting information in the form of minority charges comprising
a substrate of semiconductor material,
an insulating layer of substantially uniform thickness on one surface of said substrate,
a plurality of electrode pairs disposed upon said insulating layer, a first electrode of each of said electrode pairs having a portion which overlaps the second electrode of each of said electrode pairs, the first and second electrode of each electrode pair being in the same relative positions and of the same relative dimensions, and the first electrode of each electrode pair being laterally separated from the second electrode of an adjacent electrode pair by a separation of a predetermined length,
a plurality of first conduction regions in said substrate and proximate to said surface of said substrate, said first conduction regions being heavily doped to a conductivity material type opposite to that of said substrate, said first conduction regions being located opposite to and substantially coextensive with said separations between adjacent electrode pairs,
a plurality of second conduction regions in said substrate and proximate to said surface of said substrate, said second conduction region being of the same conductivity material type as said substrate and having a substantially greater charge density than said substrate, said second conduction regions being located adjacent to said first conduction regions and underlying a portion of said first electrode of each of said electrode pairs,
means for electrically connecting said second electrode of each of said electrode pairs with said first conduction region which is adjacent to it, and
means for impressing a single time varying voltage pulse upon said first electrode of each of said electrode pairs to cause a series of potential wells to move in said predetermined direction along said surface of said substrate, which potential wells carry said packets of minority charges through said device in said predetermined direction.

7. The uniphase charge transfer device of claim 6 wherein said first conduction regions have a charge density of approximately $10^{19}$ atoms/cm$^3$, and said second conduction regions have a charge density of approximately $10^{17}$ atoms/cm$^3$.

8. The uniphase charge transfer device of claim 6 wherein said substrate comprises N type semiconductor material, said first conduction regions comprise P++ type semiconductor material, and said second conduction regions comprise N+ type semiconductor material.

9. The uniphase charge transfer device of claim 6 wherein said substrate comprises P type semiconductor material, said first conduction regions comprise N++ type semiconductor material, and said second conduction regions comprise P+ type semiconductor materials.

10. The uniphase charge transfer semiconductor device of claim 6 wherein said means for electrically connecting said second electrode of each of said electrode pairs with said first conduction region which is adjacent to it comprises capacitive means.

* * * * *